(12) United States Patent
Xu

(10) Patent No.: US 10,877,340 B2
(45) Date of Patent: Dec. 29, 2020

(54) TFT ARRAY SUBSTRATE, FABRICATION METHOD THEREOF AND LIQUID CRYSTAL DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Hongyuan Xu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 393 days.

(21) Appl. No.: 15/743,976

(22) PCT Filed: Dec. 19, 2017

(86) PCT No.: PCT/CN2017/117148
§ 371 (c)(1),
(2) Date: Jan. 11, 2018

(87) PCT Pub. No.: WO2019/095493
PCT Pub. Date: May 23, 2019

(65) Prior Publication Data
US 2020/0150502 A1    May 14, 2020

(30) Foreign Application Priority Data
Nov. 16, 2017 (CN) .......................... 2017 1 1140867

(51) Int. Cl.
G02F 1/1362 (2006.01)
H01L 27/12 (2006.01)

(52) U.S. Cl.
CPC .. G02F 1/136286 (2013.01); G02F 1/136227 (2013.01); H01L 27/124 (2013.01);
(Continued)

(58) Field of Classification Search
CPC ......... G02F 1/136286; G02F 1/136227; G02F 2201/123; G02F 1/133345;
(Continued)

(56) References Cited

U.S. PATENT DOCUMENTS

2010/0330750 A1* 12/2010 Lee ........................ B82Y 10/00
                                                    438/151
2012/0009707 A1*  1/2012 Chae ................... H01L 27/1222
                                                    438/34
(Continued)

FOREIGN PATENT DOCUMENTS

CN        1943039      4/2007
CN      102005449      4/2011
(Continued)

*Primary Examiner* — Nathanael R Briggs
(74) *Attorney, Agent, or Firm* — Hemisphere Law, PLLC; Zhigang Ma

(57) ABSTRACT

A TFT array substrate, a fabrication method thereof and a LCD panel are provided. The TFT array substrate adopts the transparent silicon-based nanolines to form the semiconductor layer of the TFT, adopts the transparent material to form the gate electrode of the TFT, and has the pixel electrode covering the region occupied by the TFT, such that the illumination emitted by the backlight can pass through the whole TFT and the pixel electrode, i.e. the pixel portion occupied by the TFT 20 is also transparent, and thus the aperture ratio can be significantly increased to enhance transmittance and display effect of high PPI LCD panels.

4 Claims, 7 Drawing Sheets

(52) U.S. Cl.
CPC ...... *H01L 27/1222* (2013.01); *H01L 27/1259* (2013.01); *G02F 2201/123* (2013.01)

(58) Field of Classification Search
CPC ..... G02F 2001/133357; H01L 27/1222; H01L 27/124; H01L 27/1259
See application file for complete search history.

(56) References Cited

U.S. PATENT DOCUMENTS

2013/0228750 A1\* 9/2013 Chae ...................... B82Y 10/00
257/24
2015/0243691 A1\* 8/2015 Jia .......................... G02F 1/1368
257/72
2015/0370144 A1\* 12/2015 Yamazaki ............... G09F 9/372
359/296

FOREIGN PATENT DOCUMENTS

| CN | 102629569 | 8/2012 |
| CN | 102877022 | 1/2013 |
| CN | 104218070 | 12/2014 |
| CN | 103633099 A | 3/2015 |
| CN | 106816473 A | 6/2017 |
| JP | 2007081362 | 3/2007 |

\* cited by examiner

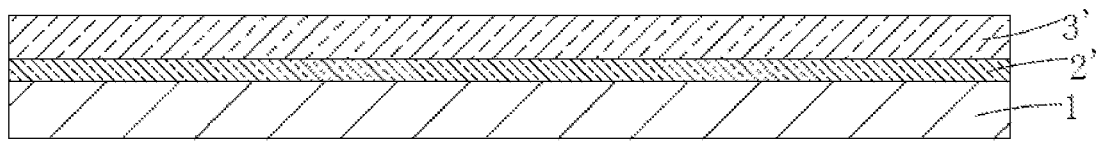
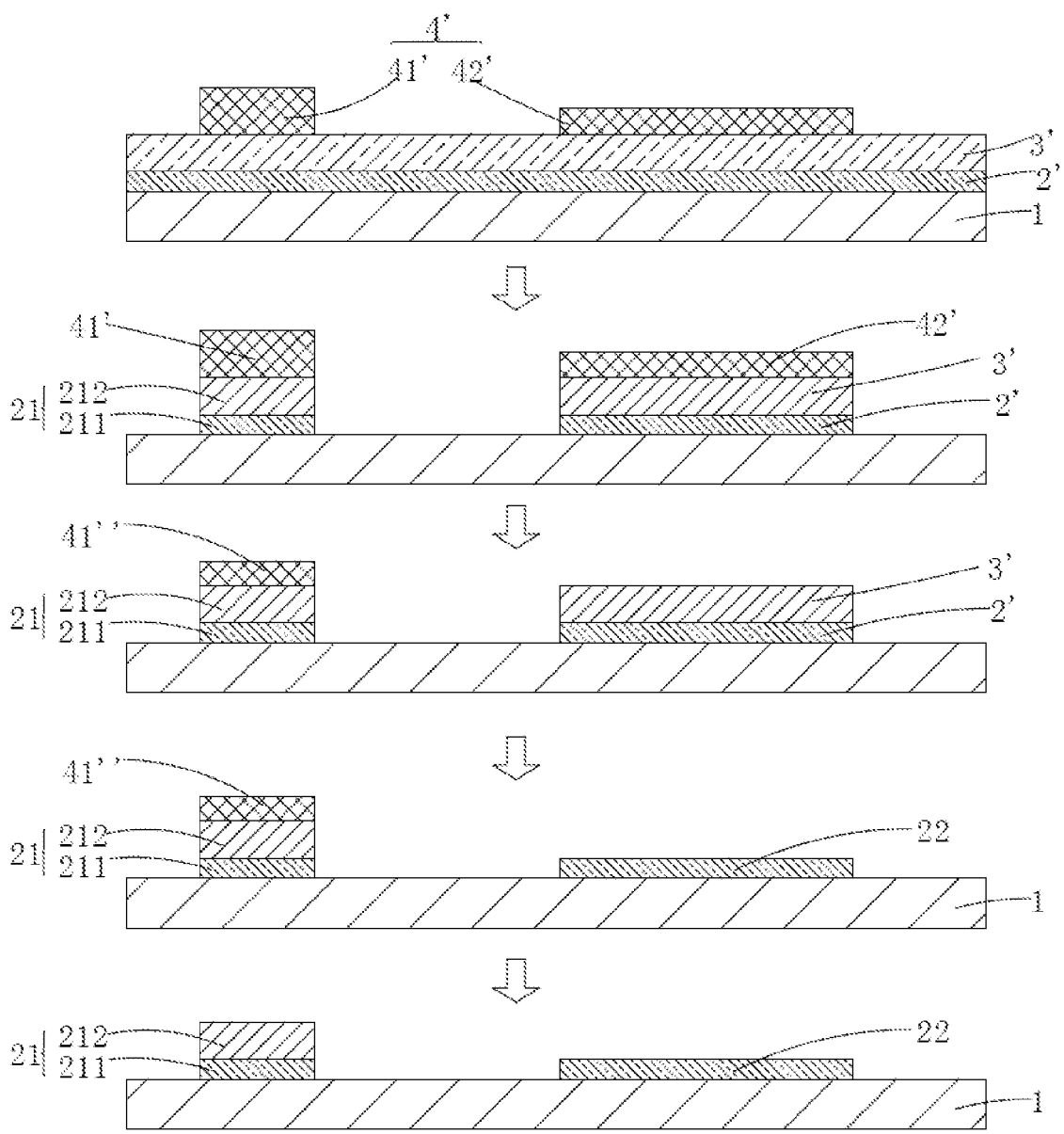
FIG. 4
FIG. 5

TFT ARRAY SUBSTRATE, FABRICATION METHOD THEREOF AND LIQUID CRYSTAL DISPLAY PANEL

RELATED APPLICATIONS

The present application is a National Phase of International Application Number PCT/CN2017/117148, filed on Dec. 19, 2017, and claims the priority of China Application Number 201711140867.7, filed on Nov. 16, 2017.

FIELD OF THE DISCLOSURE

The present invention is related to the display technology, and more particularly is related to a thin film transistor (TFT) array substrate, a fabrication method thereof, and a liquid crystal display (LCD) panel.

BACKGROUND

In the field of display technology, the CRT displays had been gradually replaced by the flat panel displays, such as the liquid crystal display (LCD).

Flat panel displays are mainly divided into light emissive displays and light transmissive displays. Light emissive flat panel displays modulate brightness and color of each of the illumination spots (i.e. sub-pixels) by using the voltage signal to display the image directly. Light transmissive flat panel displays do not generate illumination itself but use the voltage signal to control the transmissive brightness of a specific light source at each of the illumination spots (i.e. sub-pixels) so as to achieve the purpose of displaying images.

LCD is a widely used light transmissive flat panel display, which includes a LCD panel and a backlight module. The LCD panel includes a thin film transistor array substrate (TFT array substrate), a color filter (CF) substrate, and a liquid crystal layer interposed between the two substrates. The displaying mechanism of LCD is to modulate the light field strength of the backlight by using the liquid crystal switches. Wherein, the TFT array substrate has a plurality of TFTs arranged in a matrix, and each TFT is located in a corresponding sub-pixel area. In the prior art, the TFT is usually an opaque element, which may influence the aperture ratio of the pixel.

Attending with the development and popularity of the new products such as augmented reality (AR) and virtual reality (VR) products, people are asking for liquid crystal displays with ultra-high pixels per inch (PPI). For the LCD panels, the area ratio occupied by the TFT within one single sub-pixel area will get higher attending with the increasing PPI; that is, for the LCD panels with high PPI, a great portion of the aperture ratio of the pixel would be sacrificed due to the TFT such that the LCD panels with high PPI usually have a lower transmittance and a poor display effect.

SUMMARY

It is an object of the present invention to provide a TFT array substrate, which is capable to have the portion of the pixel region occupied by the TFT become transparent to increase aperture ratio so as to enhance transmittance as well as display effect of the LCD panels with high PPI.

It is another object of the present invention to provide a fabrication method of a TFT array substrate, which is capable to fabricate a TFT array substrate with a higher aperture ratio so as to enhance transmittance as well as display effect of the LCD panels with high PPI.

It is an object of the present invention to provide a LCD panel, which may have a higher aperture ratio and better display effect under the premise of high PPI.

In order to achieve the aforementioned objects, a TFT array substrate is provided in the present invention. The TFT array substrate comprises: a substrate; a scan line, disposed on the substrate; a gate electrode, disposed on the substrate and connected to the scan line, and the gate electrode being formed of a transparent conductive material; a gate dielectric layer, covering the substrate, the scan line, and the gate electrode; a plurality of silicon-based nanolines, disposed on the gate dielectric layer, wherein a projection of the plurality of silicon-based nanelines is situated on the gate electrode; a data line, disposed on the gate dielectric layer and insulatedly crossing the scan line; a source electrode, disposed on the gate dielectric layer, connected to the data line, and in contact with the plurality of silicon-based nanolines; a drain electrode, disposed on the gate dielectric layer and in contact with the plurality of silicon-based nanolines; a passivation layer, covering the gate dielectric layer, the silicon-based nanolines, the data line, the source electrode, and the drain electrode; and a pixel electrode, disposed on the passivation layer and in contact with the drain electrode through a via penetrating the passivation layer. Wherein the gate electrode, the plurality of silicon-based nanolines, the source electrode and drain electrode compose a TFT, and the pixel electrode covers a region occupied by the TFT.

In accordance with an embodiment of the TFT array substrate of the present invention, the transparent conductive material forming the gate electrode is ITO, the scan line includes a lower layer and a metal layer pattern which is stacked on the lower layer, the lower layer and the gate electrode are located on a same layer, and the lower layer and the gate electrode are formed of an identical material.

In accordance with an embodiment of the TFT array substrate of the present invention, a diameter of the silicon-based nanoline is ranged between 50 nm-100 nm.

In accordance with an embodiment of the TFT array substrate of the present invention, the source electrode is comb-shaped and includes a plurality of source electrode branches which are parallel to each other, each of the source electrode branches crosses and is in contact with the plurality of the silicon-based nanolines, the drain electrode is comb-shaped and includes a plurality of drain electrode branches which are parallel to each other, each of the drain electrode branches crosses and is in contact with the plurality of the silicon-based nanolines, and the source electrode branches and the drain electrode branches are disposed alternatively.

In accordance with an embodiment of the TFT array substrate of the present invention, a width of the source electrode branch and a width of the drain electrode branch are both smaller than 2 μm.

A fabrication method of a TFT array substrate is also provided in the present invention. The fabrication method comprises the steps of: step S1, providing a substrate, and consecutively depositing a transparent conductive material layer and a first metal layer on the substrate; step S2, patterning the transparent conductive material layer and the first metal layer by using a half-tone mask to form a scan line and a gate electrode connected to the scan line, wherein the gate electrode is a transparent conductive material pattern, the scan line includes a lower layer and a metal layer pattern which is stacked on the lower layer, and the lower layer and the gate electrode are located on a same layer; step S3, depositing a gate dielectric layer on the substrate, the scan line, and the gate electrode; step S4, forming a plurality of silicon-based nanolines on the gate dielectric layer, wherein a projection of the plurality of silicon-based nanolines is situated on the gate electrode; step S5, depositing a second metal layer on the gate dielectric layer and the plurality of silicon-based nanolines and patterning the second metal layer to form a data line, a source electrode, and a drain electrode, wherein the data line insulatedly crosses the scan line, the source electrode is connected to the data line and in contact with the plurality of silicon-based nanolines, and the drain electrode is in contact with the plurality of silicon-based nanolines, wherein the gate electrode, the plurality of silicon-based nanolines, the source electrode, and the drain electrode compose a TFT; step S6, depositing a passivation layer on the gate dielectric layer, the silicon-based nanolines, the data line, the source electrode, and the drain electrode and patterning the passivation layer to form a via penetrating the passivation layer; and step S7, depositing a transparent conductive thin film on the passivation layer and patterning the transparent conductive thin film to form a pixel electrode covering a region occupied by the TFT, wherein the pixel electrode is in contact with the drain electrode through the via penetrating the passivation layer.

In accordance with an embodiment of the fabrication method provided in the present invention, the transparent dielectric material layer is an ITO layer, and a diameter of the silicon-based nanoline is ranged between 50 nm-100 nm.

In accordance with an embodiment of the fabrication method provided in the present invention, the source electrode is comb-shaped and includes a plurality of source electrode branches which are parallel to each other, each of the source electrode branches crosses and is in contact with the plurality of the silicon-based nanolines, the drain electrode is comb-shaped and includes a plurality of drain electrode branches which are parallel to each other, and each of the drain electrode branches crosses and is in contact with the plurality of the silicon-based nanolines, and the source electrode branches and the drain electrode branches are disposed alternatively.

In accordance with an embodiment of the fabrication method provided in the present invention, a width of the source branch and a width of the drain branch are both smaller than 2 μm.

A LCD panel is also provided in the present invention, which comprises the aforementioned TFT array substrate.

The present invention has the following advantages. The TFT array substrate provided in the present invention adopts the transparent silicon-based nanolines to form the semiconductor layer of the TFT, adopts the transparent material to form the gate electrode of the TFT, and has the pixel electrode covering the region occupied by the TFT, such that the illumination emitted by the backlight can pass through the whole TFT and the pixel electrode, i.e. the pixel portion occupied by the TFT is also transparent, and thus the aperture ratio can be significantly increased to enhance transmittance and display effect of high PPI LCD panels. The fabrication method for the TFT array substrate provided in the present invention is capable to fabricate the aforementioned TFT array substrate with pixels of a high aperture ratio. The LCD panel provided in the present invention includes the aforementioned TFT array substrate such that the LCD panel may have a higher aperture ratio and better display effect under the premise of high PPI.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures:

FIG. 4 is a schematic cross-section view of the structure corresponding to step S1 of the fabrication method of the TFT array substrate provided in the present invention;

FIG. 5 is a schematic cross-section view of the structure corresponding to the execution of step S2 of the fabrication method of the TFT array substrate provided in the present invention;

DETAILED DESCRIPTION OF PREFERRED EMBODIMENTS

The disclosure will be further described in detail with reference to accompanying drawings and preferred embodiments as follows.

Figure 1:
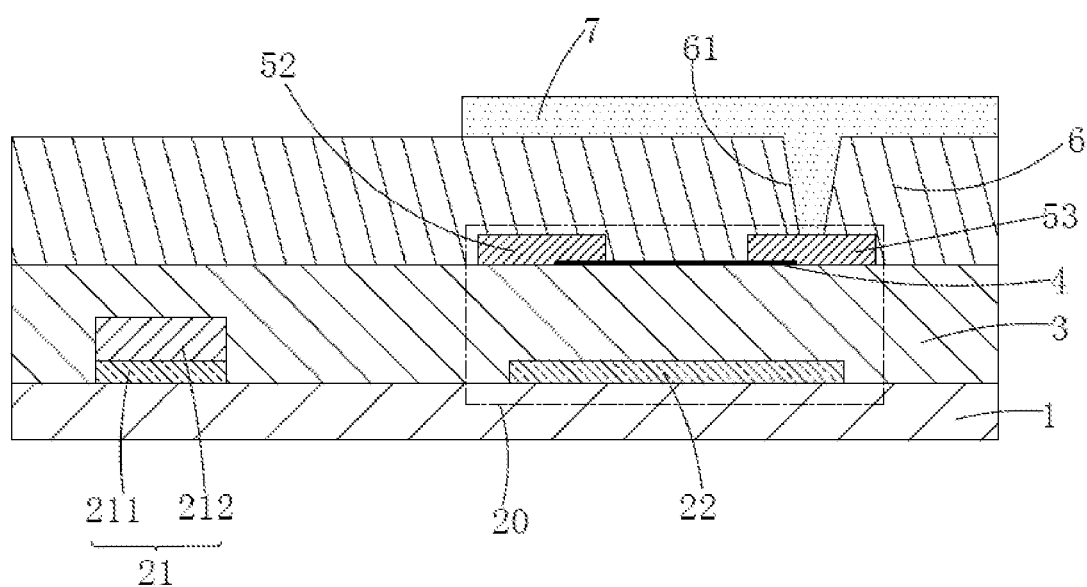
FIG. 1 is a schematic cross-section view of the TFT array substrate provided in the present invention.
Figure 2:
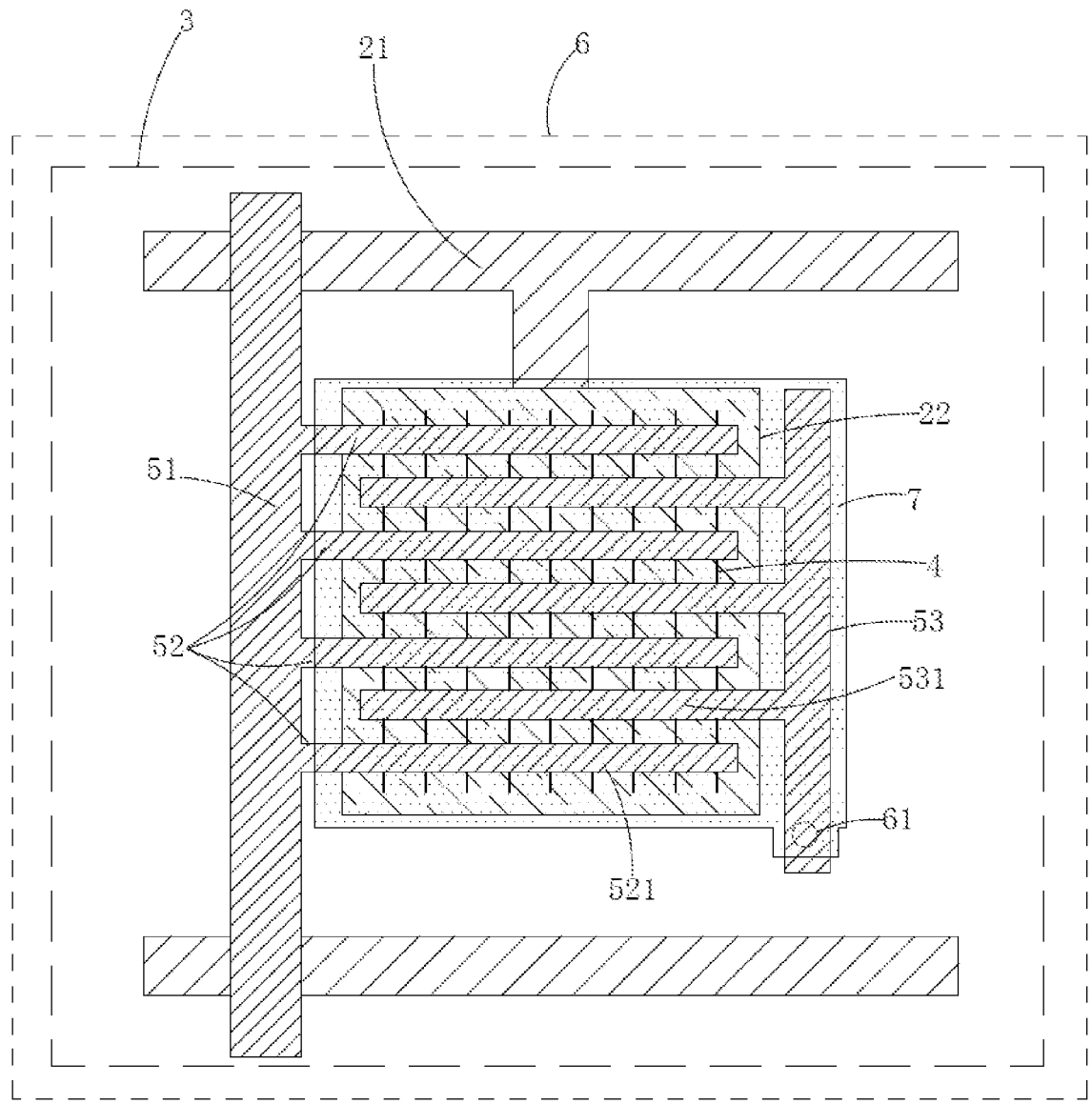
FIG. 2 is a schematic top view of the TFT array substrate provided in the present invention.
Figure 6:
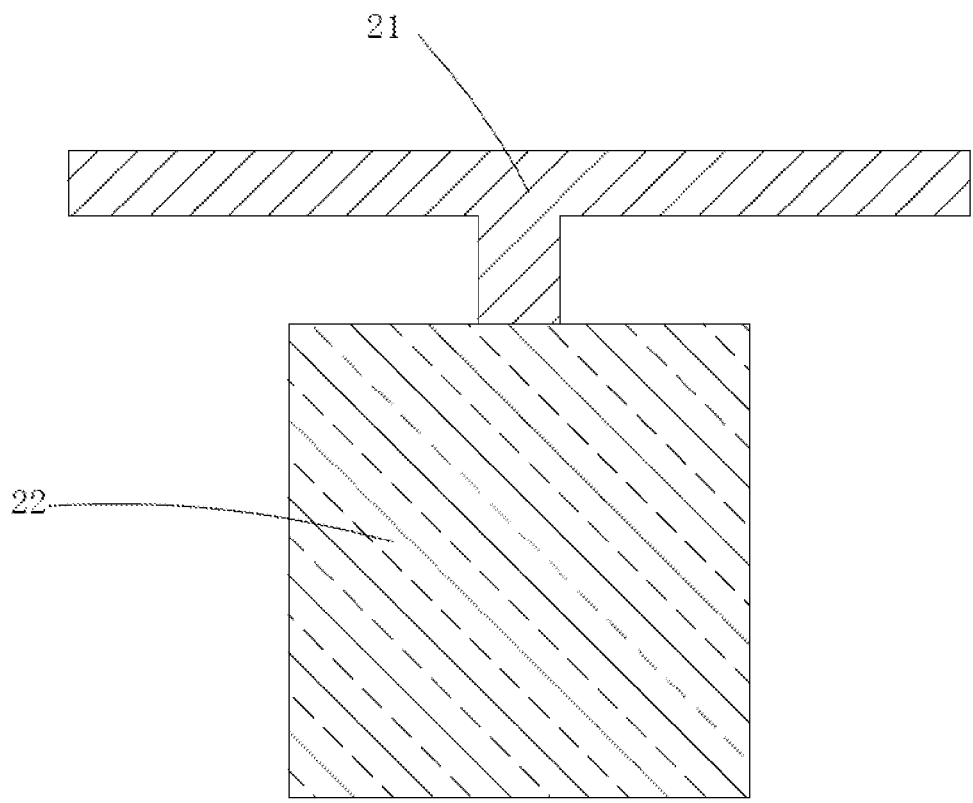
FIG. 6 is a schematic top view of the structure after completion of step S2 of the fabrication method of the TFT array substrate provided in the present invention.
Figure 7:
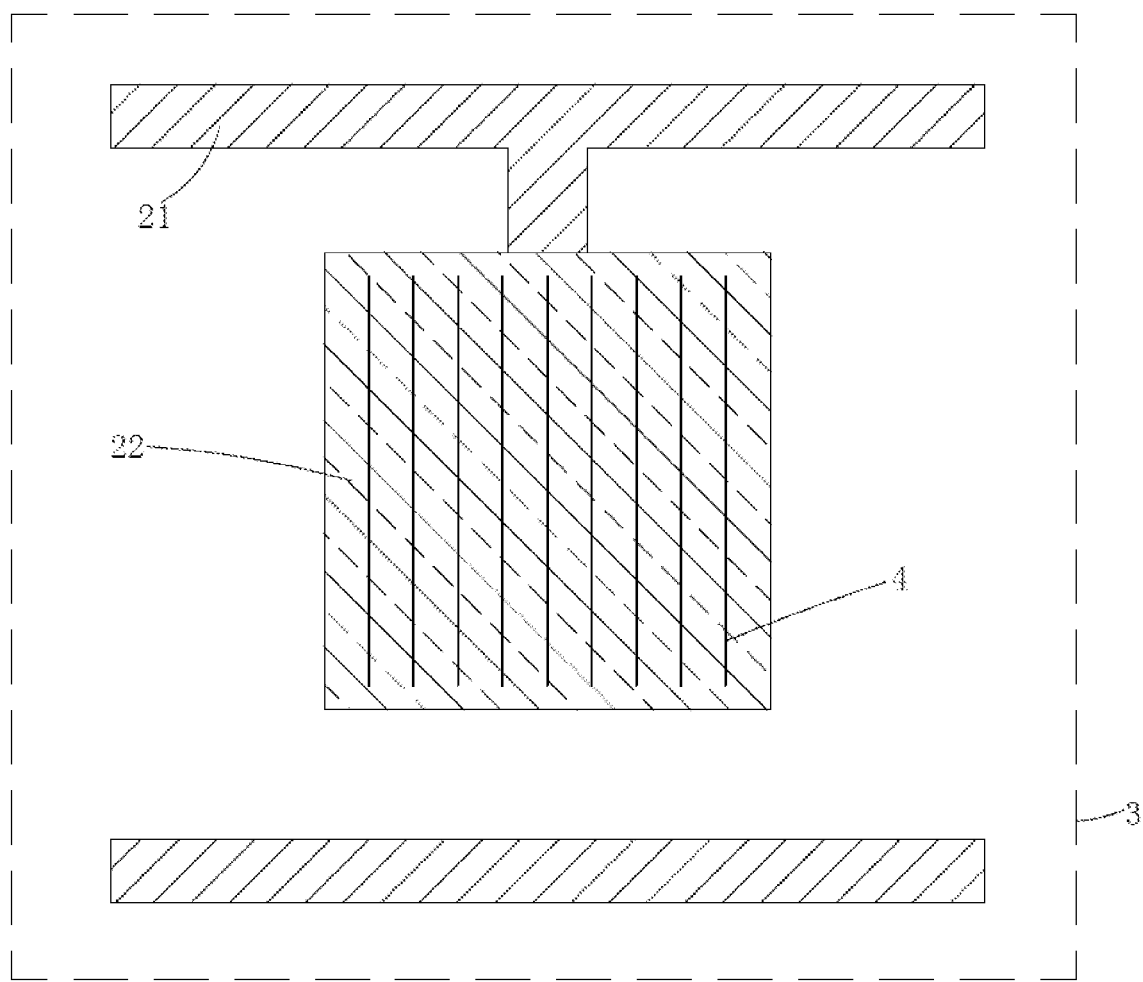
FIG. 7 is a schematic top view of the structure corresponding to step S4 of the fabrication method of the TFT array substrate provided in the present invention.
Figure 9:
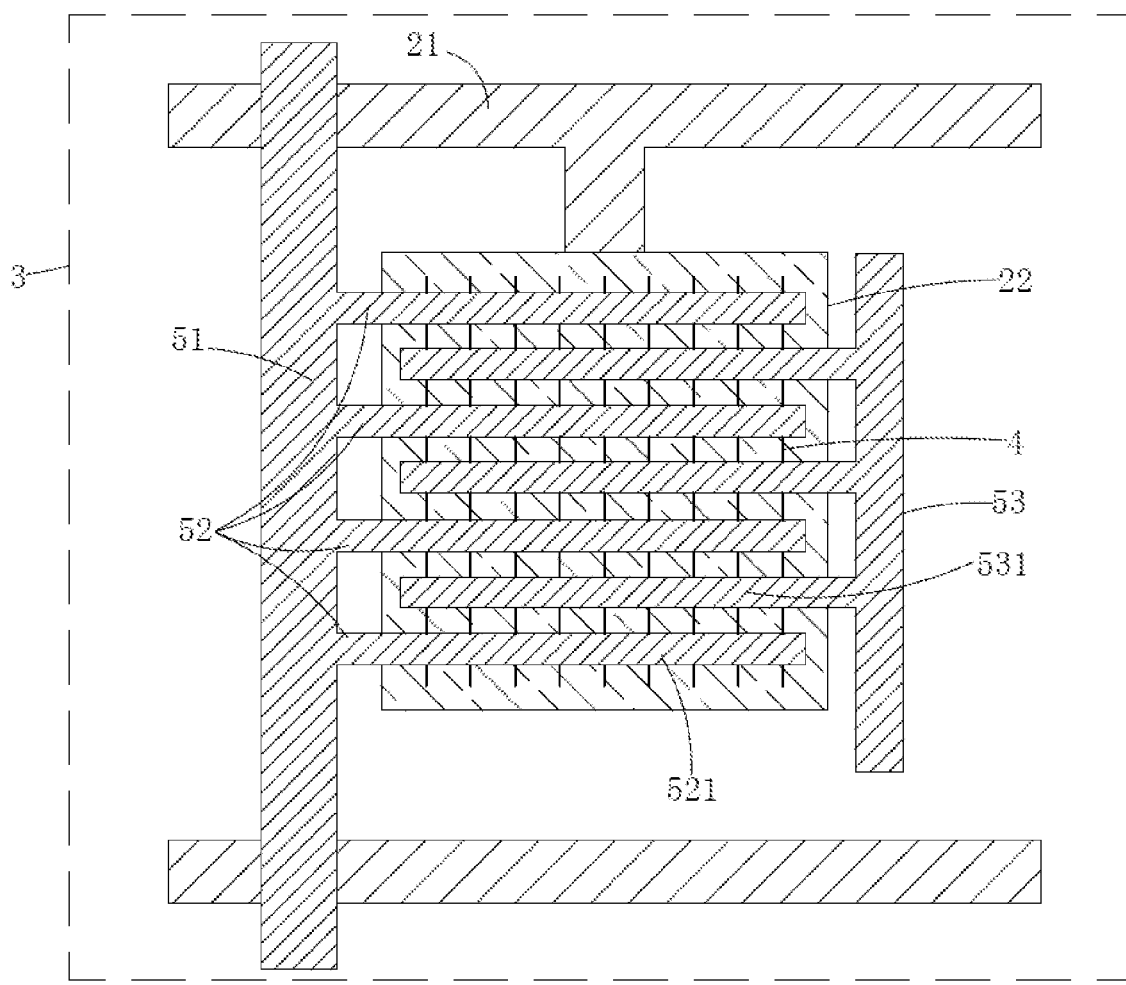
FIG. 9 is a schematic top view of the structure corresponding to step S5 of the fabrication method of the TFT array substrate provided in the present invention.

Please refer to FIG. 1 and FIG. 2, together with FIG. 6, FIG. 7, and FIG. 9, a TFT array substrate is provided in the present invention, which comprises: a substrate 1; a scan line 21, disposed on the substrate 1; a gate electrode 22, disposed on the substrate 1 and connected to the scan line 21, and the gate electrode 22 being formed of a transparent conductive material; a gate dielectric layer 3, covering the substrate 1, the scan line 21, and the gate electrode 22; a plurality of silicon-based nanolines 4, disposed on the gate dielectric layer 3, wherein a projection of the plurality of silicon-based nanolines 4 is situated on the gate electrode 22; a data line 51, disposed on the gate dielectric layer 3 and insulatedly crossing the scan line 21; a source electrode 52, disposed on the gate dielectric layer 3, connected to the data line 51, and in contact with the plurality of silicon-based nanolines 4; a drain electrode 53, disposed on the gate dielectric layer 3 and in contact with the plurality of silicon-based nanolines 4; a passivation layer 6, covering the gate dielectric layer 3, the silicon-based nanolines 4, the data line 51, the source electrode 52, and the drain electrode 53; and a pixel electrode 7, disposed on the passivation layer 6 and in contact with the drain electrode 53 through a via 61 penetrating the passivation layer 6. Wherein the gate electrode 22, the plurality of silicon-based nanolines 4, the source electrode 52, and drain electrode 53 compose a TFT 20, and the pixel electrode 7 covers a region occupied by the TFT 20.

Concretely speaking, it is preferred to use a glass substrate as the aforementioned substrate 1.

The transparent conductive materials forming the gate electrode 22 is Indium Tin Oxide (ITO). The scan line 21 includes a lower layer 211 and a metal layer pattern 212 which is stacked on the lower layer 211, and the lower layer 211 and the gate electrode 22 are of the same layer. The lower layer 211 and the gate electrode 22 are formed of the same material. Furthermore, the metal layer pattern 212 can be formed by using the material such as Al, Mo or Cu.

The gate dielectric layer 3 can be formed by using the material of SiOx or SiNx.

The diameter of the silicon-based nanoline 4 is ranged between about 50 nm~100 nm. The silicon-based nanoline has the advantages such as high transparency, low fabrication temperature (<350° C.), high electron mobility, and insensitive to illumination, and thus is utilized as the semiconductor layer of the TFT in the present invention. Furthermore, the extending direction of the silicon-based nanolines 4 is parallel to the extending direction of the data line 51.

The data line 51, the source electrode 52, and the drain electrode 53 may be formed by using the metal material such as Al, Mo, Cu. In order to reduce the trench width of the TFT 20, it is preferred to have the source electrode 52 and the drain electrode 53 designed as a comb shape. The source electrode 52 includes a plurality of source electrode branches 521 which are parallel to each other, and each of the source electrode branches 521 crosses and is in contact with the plurality of the silicon-based nanolines 4. The drain electrode 53 includes a plurality of drain electrode branches 531 which are parallel to each other, and each of the drain electrode branches 531 crosses and is in contact with the plurality of the silicon-based nanolines 4. The source electrode branches 521 and the drain electrode branches 531 are disposed alternatively. Furthermore, because the source electrode 52 and the drain electrode 53 are formed of metal material, in order to reduce the amount of illumination shielded by the source electrode 52 and the drain electrode 53, it is designed to have both the width of the source electrode branch 521 and the width of the drain electrode branch 531 smaller than 2 μm so as to reduce the light shielding effect of the source electrode 52 and the drain electrode 53.

The passivation layer 6 can be formed of SiOx or SiNx.

The pixel electrode 7 can be formed of the transparent ITO film.

In addition, in order to reduce parasitic capacitance between the pixel electrode 7 and the source electrode 52 as well as the drain electrode 53, a thicker inorganic layer, such as a color resist layer or a planarization layer, can be further deposited on the passivation layer 6.

The TFT array substrate adopts the transparent silicon-based nanolines 4 to form the semiconductor layer of the TFT 20, adopts the transparent material to form the gate electrode 22 of the TFT 20, and has the pixel electrode 7 covering the region occupied by the TFT 20, such that as the TFT array substrate is applied to the LCD panel, the illumination emitted by the backlight can pass through the whole TFT 20 and the pixel electrode 7, i.e. the pixel portion occupied by the TFT 20 is also transparent, and thus the aperture ratio can be significantly increased to enhance transmittance and display effect of high PPI LCD panels.

Figure 3:
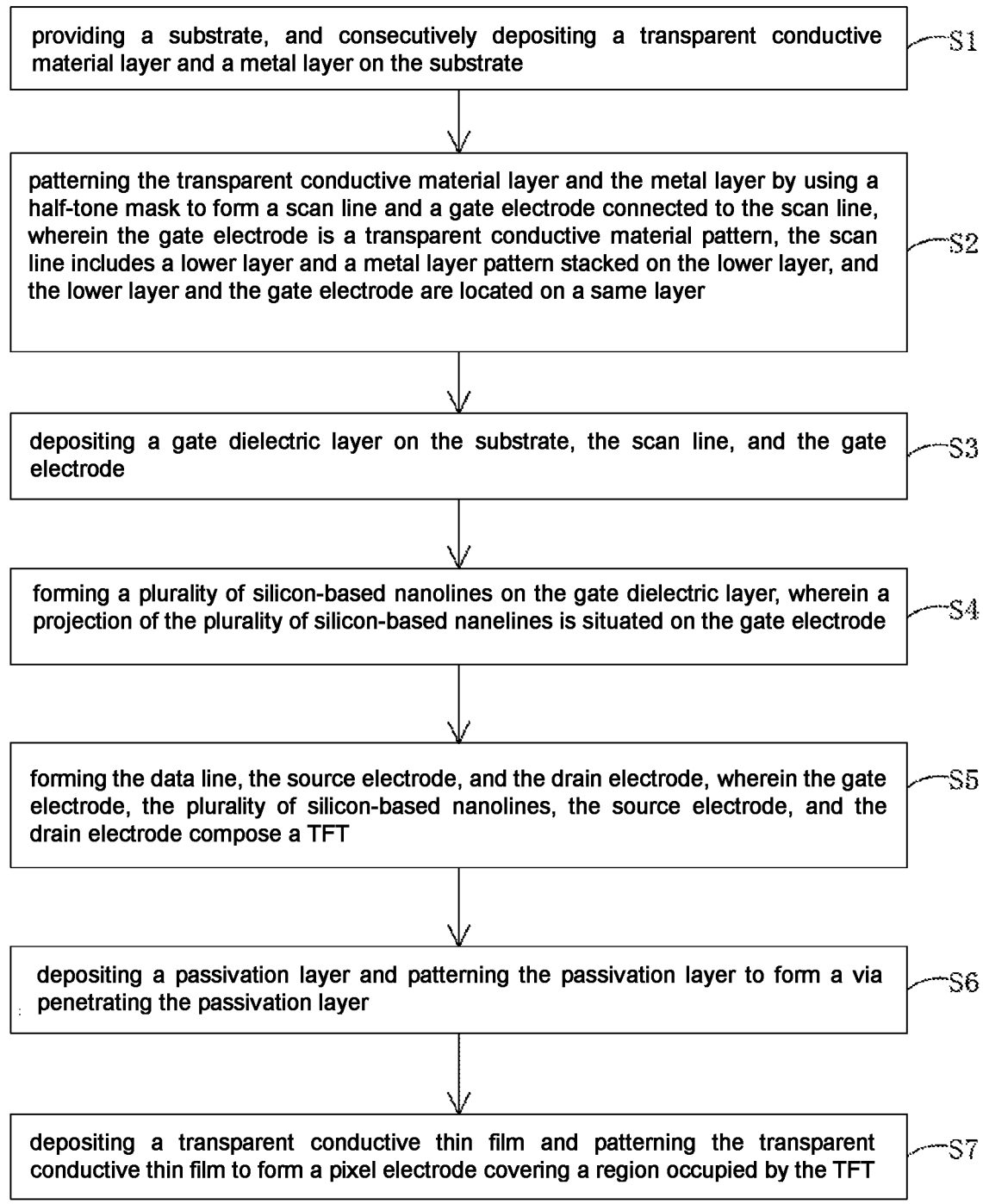
FIG. 3 is a flow chart showing the fabrication method of the TFT array substrate provided in the present invention.

Please refer to FIG. 3, a fabrication method of a TFT array substrate is also provided in the present invention, which comprises the following steps:

As shown in FIG. 4, step S1 is to provide a substrate 1 and consecutively deposit a transparent conductive material layer 2' and a first metal layer 3' on the substrate 1.

Concretely speaking, as a preferred embodiment, the substrate 1 is a glass substrate, the transparent conductive material layer 2' is an ITO layer, and the first metal layer 3' can be formed by using the material such as Al, Mo and Cu.

As shown in FIG. 5 and FIG. 6, step S2 is to pattern the transparent conductive material layer 2' and the first metal layer 3' by using a half-tone mask to form the scan line 21 and the gate electrode 22 connected to the scan line 21. The gate electrode 22 is a transparent conductive material pattern. The scan line 21 includes a lower layer 211 and a metal layer pattern 212 which is stacked on the lower layer 211, and the lower layer 211 and the gate electrode 22 are of the same layer.

Concretely speaking, the step S2 can be implemented by the following process.

Firstly, a photoresist layer 4' is deposited on the first metal layer 3'.

Then, a lithographic step is carried out to pattern the photoresist layer 4' by using the half-tone mask so as to form the alternatively arranged first photoresist regions 41' and second photoresist regions 42'. The first photoresist region 41' is corresponding to the scan line region for forming the scan line, the second photoresist region 42' is corresponding to the gate electrode region for forming the gate electrode, and the thickness of the first photoresist region 41' is greater than the thickness of the second photoresist region 42'.

Afterward, a wet etching process is applied to the first metal layer 3' and the transparent conductive material layer 2'.

Then, a plasma ashing process is applied to the first photoresist region 41' and the second photoresist region 42' to remove the second photoresist region 42' and reduce the thickness of the first photoresist region 41', so as to form a first photoresist sub-region 41'.

Thereafter, by using the first photoresist sub-region 41" as the mask to execute the wet etching process, the gate electrode 22 with the pattern of the transparent conductive material layer can be formed.

Finally, the first photoresist sub-region 41' is removed such that the scan line 21 includes the lower layer 211 and the metal layer pattern 212 stacked on the lower layer 211, and the lower layer 211 and the gate electrode 22 are of the same layer, can be formed.

Figure 8:
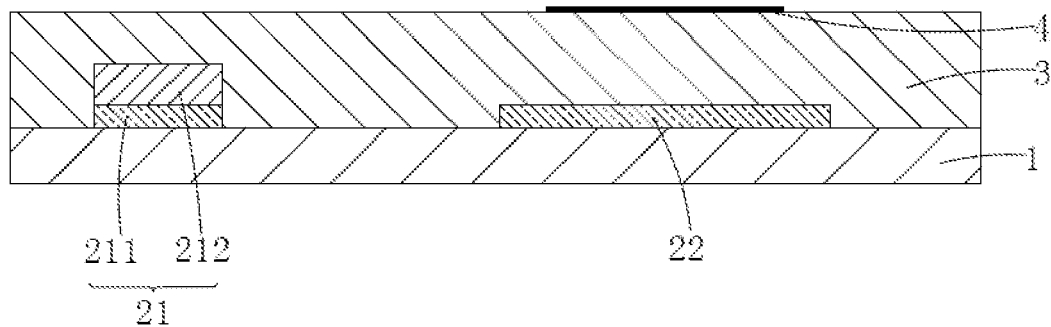
FIG. 8 is a schematic cross-section view of the structure corresponding to step S4 of the fabrication method of the TFT array substrate provided in the present invention.

Please refer to FIG. 8, step S3 is to deposit a gate dielectric layer 3 on the substrate 1, the scan line 21, and the gate electrode 22.

Concretely speaking, the gate dielectric layer 3 can be formed by using SiOx or SiNx.

Please refer to FIG. 7 and FIG. 8, step S4 is to forming a plurality of silicon-based nanolines 4 on the gate dielectric layer 3, wherein a projection of the plurality of silicon-based nanolines 4 is situated on the gate electrode 22.

Concretely speaking, the diameter of the silicon-based nanoline 4 is ranged between about 50 nm~100 nm. The silicon-based nanoline has the advantages such as high transparency, low fabrication temperature (<350° C.), high electron mobility, and insensitive to illumination. Furthermore, the extending direction of the silicon-based nanolines 4 is parallel to the extending direction of the scan line 21.

Figure 10:
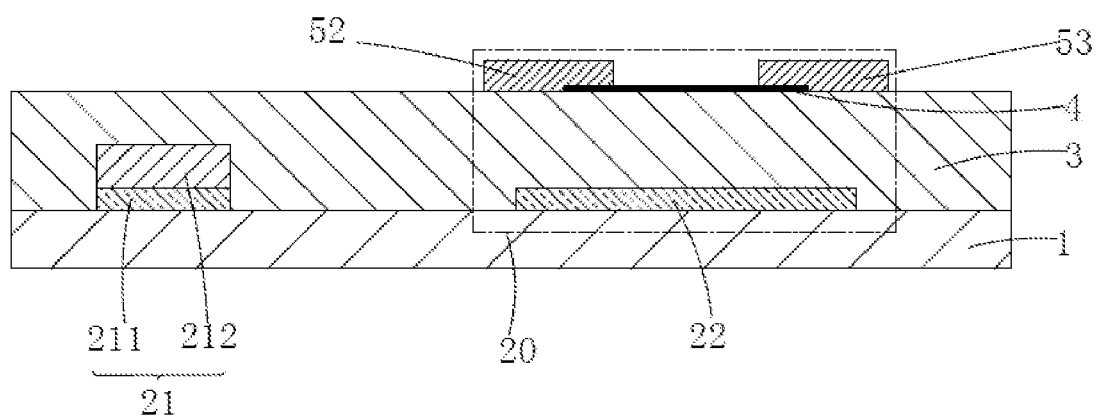
FIG. 10 is a schematic cross-section view of the structure corresponding to step S5 of the fabrication method of the TFT array substrate provided in the present invention.

Please refer to FIG. 9 and FIG. 10, step S5 is to deposit a second metal layer on the gate dielectric layer 3 and the plurality of silicon-based nanolines 4 and pattern the second metal layer to form the data line 51, the source electrode 52, and the drain electrode 53, wherein the data line 51 insulatedly crosses the scan line 21, the source electrode 52 is connected to the data line 51 and in contact with the plurality of silicon-based nanolines 4, and the drain electrode 53 is in contact with the plurality of silicon-based nanolines 4.

The gate electrode 22, the plurality of silicon-based nanolines 4, the source electrode 52, and the drain electrode 53 compose the TFT 20, and the silicon-based nanolines are utilized as the semiconductor layer of the TFT 20.

Concretely speaking, the second metal layer of step S5 may use the metal material such as Al, Mo, Cu.

The extending direction of the data line 51 is parallel to the extending direction of the silicon-based nanolines 4.

In order to reduce the trench width of the TFT 20, it is preferred to have the source electrode 52 and the drain electrode 53 designed as a comb shape. The source electrode 52 includes a plurality of source electrode branches 521 which are parallel to each other, and each of the source electrode branches 521 crosses and is in contact with the plurality of the silicon-based nanolines 4. The drain electrode 53 includes a plurality of drain electrode branches 531 which are parallel to each other, and each of the drain electrode branches 531 crosses and is in contact with the plurality of the silicon-based nanolines 4. The source electrode branches 521 and the drain electrode branches 531 are disposed alternatively. Furthermore, because the source electrode 52 and the drain electrode 53 are formed of metal material, in order to reduce the amount of illumination shielded by the source electrode 52 and the drain electrode 53, it is designed to have both the width of the source electrode branch 521 and the width of the drain electrode branch 531 smaller than 2 μm so as to reduce the light shielding effect of the source electrode 52 and the drain electrode 53.

Please refer to FIG. 1, step S6 is to deposit a passivation layer 6 on the gate dielectric layer 3, the silicon-based nanolines 4, the data line 51, the source electrode 52, and the drain electrode 53 and pattern the passivation layer 6 to form a via 61 penetrating the passivation layer 6.

Concretely speaking, the passivation layer 6 can be formed by using SiOx or SiNx.

Please refer to FIG. 1 and FIG. 2, step S7 is to deposit a transparent conductive thin film on the passivation layer 6 and patterning the transparent conductive thin film to form the pixel electrode 7 covering the region occupied by the TFT 20, wherein the pixel electrode 7 is in contact with the drain electrode 53 through the via 61 penetrating the passivation layer 6.

Concretely speaking, the transparent conductive thin film is an ITO thin film.

The TFT array substrate provided by using the aforementioned fabrication method adopts the transparent silicon-based nanolines 4 to form the semiconductor layer of the TFT 20, adopts the transparent material to form the gate electrode 22 of the TFT 20, and has the transparent pixel electrode 7 covering the region occupied by the TFT 20, such that as the TFT array substrate is applied to the LCD panel, the illumination emitted by the backlight can pass through the whole TFT 20 and the pixel electrode 7, i.e. the pixel portion occupied by the TFT 20 is also transparent, and thus the aperture ratio can be significantly increased to enhance transmittance and display effect of high PPI LCD panels.

A LCD panel including the TFT array substrate shown in FIG. 1 and FIG. 2 is also provided in the present invention.

Thus, the LCD panel has the advantages of higher aperture ratio and better display effect under the premise of high PPI.

In conclusion, the TFT array substrate provided in the present invention adopts the transparent silicon-based nanolines to form the semiconductor layer of the TFT, adopts the transparent material to form the gate electrode of the TFT, and has the pixel electrode covering the region occupied by the TFT, such that the illumination emitted by the backlight can pass through the whole TFT and the pixel electrode, i.e. the pixel portion occupied by the TFT 20 is also transparent, and thus the aperture ratio can be significantly increased to enhance transmittance and display effect of high PPI LCD panels. The fabrication method of the TFT array substrate provided in the present invention is capable to fabricate the aforementioned TFT array substrate with enhanced aperture ratio of the pixel. The LCD panel provided in the present invention includes the aforementioned TFT array substrate so as to possess a higher aperture ratio and better display effect under the premise of high PPI.

The foregoing contents are detailed description of the disclosure in conjunction with specific preferred embodiments and concrete embodiments of the disclosure are not limited to the description. For the person skilled in the art of the disclosure, without departing from the concept of the disclosure, simple deductions or substitutions can be made and should be included in the protection scope of the application.

What is claimed is:

1. A fabrication method of a TFT array substrate, comprising the steps of:
    step S1, providing a substrate, and consecutively depositing a transparent conductive material layer and a first metal layer on the substrate;
    step S2, patterning the transparent conductive material layer and the first metal layer by using a half-tone mask to form a scan line and a gate electrode connected to the scan line, wherein the gate electrode is a transparent conductive material pattern, the scan line includes a lower layer and a metal layer pattern which is stacked on the lower layer, and the lower layer and the gate electrode are located on a same layer;
    step S3, depositing a gate dielectric layer on the substrate, the scan line, and the gate electrode;
    step S4, forming a plurality of silicon-based nanolines on the gate dielectric layer, wherein a projection of the plurality of silicon-based nanolines is situated on the gate electrode;
    step S5, depositing a second metal layer on the gate dielectric layer and the plurality of silicon-based nanolines and patterning the second metal layer to form a data line, a source electrode, and a drain electrode, wherein the data line insulatedly crosses the scan line, the source electrode is connected to the data line and in contact with the plurality of silicon-based nanolines, and the drain electrode is in contact with the plurality of silicon-based nanolines, wherein the gate electrode, the plurality of silicon-based nanolines, the source electrode, and the drain electrode compose a TFT;
    step S6, depositing a passivation layer on the gate dielectric layer, the silicon-based nanolines, the data line, the source electrode, and the drain electrode and patterning the passivation layer to form a via penetrating the passivation layer; and
    step S7, depositing a transparent conductive thin film on the passivation layer and patterning the transparent conductive thin film to form a pixel electrode covering a region occupied by the TFT, wherein the pixel electrode is in contact with the drain electrode through the via penetrating the passivation layer.

2. The fabrication method of claim 1, wherein the transparent dielectric material layer is an ITO layer, and a diameter of the silicon-based nanoline is ranged between 50 nm-100 nm.

3. The fabrication method of claim 1, wherein the source electrode is comb-shaped and includes a plurality of source electrode branches which are parallel to each other, each of the source electrode branches crosses and is in contact with the plurality of the silicon-based nanolines, the drain electrode is comb-shaped and includes a plurality of drain electrode branches which are parallel to each other, and each of the drain electrode branches crosses and is in contact with the plurality of the silicon-based nanolines, and the source electrode branches and the drain electrode branches are disposed alternatively.

4. The fabrication method of claim 1, wherein a width of the source branch and a width of the drain branch are both smaller than 2 μm.

* * * * *